United States Patent [19]

Nulman

[11] Patent Number: 5,043,300
[45] Date of Patent: Aug. 27, 1991

[54] SINGLE ANNEAL STEP PROCESS FOR FORMING TITANIUM SILICIDE ON SEMICONDUCTOR WAFER

[75] Inventor: Jaim Nulman, Palo Alto, Calif.

[73] Assignee: Applied Materials, Inc., Santa Clara, Calif.

[21] Appl. No.: 510,340

[22] Filed: Apr. 16, 1990

[51] Int. Cl.$^5$ .......................................... H01L 21/283
[52] U.S. Cl. .................... 437/200; 437/192; 437/174; 437/946; 437/247; 437/949
[58] Field of Search ............... 437/192, 200, 247, 246, 437/245, 946, 173, 174, 949; 156/643; 204/298.25, 192; 357/67, 71; 148/DIG. 147

[56] References Cited

U.S. PATENT DOCUMENTS

| | | | |
|---|---|---|---|
| 4,585,517 | 4/1986 | Stemple | 156/643 |
| 4,629,635 | 12/1986 | Brors | 156/643 |
| 4,676,866 | 6/1987 | Tang et al. | 156/643 |
| 4,687,542 | 8/1987 | Davis et al. | 156/643 |
| 4,785,962 | 11/1988 | Toshima | 220/260 |
| 4,836,905 | 6/1989 | Davis et al. | 204/298 |

OTHER PUBLICATIONS

Tang, T. E., et al., "Titanium Nitride...", *IEEE Trans. on Electron Devices*, vol. ED-34, No. 3, Mar. 1987, pp. 682–688.
Morgan, A. E., et al., "Formation of...", *Rapid Thermal Processing*, MRS 1986, pp. 279–287.
Tsukamoto, K., et al., "Self-Aligned...", *IEEE IEDM Technical Digest*, 1984, pp. 130–133.
Ting, C. Y., "TiN...", *J. Vac. Sci. Technol.*, 21(1), May/Jun. 1982, pp. 14–18.
Okamoto, T., et al., "Titanium Silicidation...", *J. Appl. Phys.*, 57(12), Jun. 15, 1985, pp. 5251–5255.
Adams, E. D., et al., "Formation of TiSi$_2$...", *J. Vac. Sci. Technol.*, A 3(6), Nov./Dec. 1985, pp. 2264–2267.
Alperin, M. E., et al., "Development of...", IEEE Trans. on Electron Devices, vol. ED-32, No. 2, Feb. 1985, pp. 141–149.

*Primary Examiner*—Brian E. Hearn
*Assistant Examiner*—T. N. Quach
*Attorney, Agent, or Firm*—John P. Taylor

[57] ABSTRACT

An improved process is disclosed for forming a conductive layer of titanium silicide on a silicon semiconductor wafer using a single annealing step which comprises the steps of forming a titanium layer over the wafer in a vacuum deposition chamber in the substantial absence of oxygen-bearing gases; transferring the titanium coated wafer to a sealed annealing chamber without substantially exposing the newly formed titanium layer to oxygen-bearing gases; and then annealing the titanium-coated silicon semiconductor wafer in a nitrogen-bearing atmosphere in the sealed annealing chamber at a first temperature of from about 500° C. to about 695° C., in the substantial absence of oxygen-bearing gases, to form a titanium silicide layer and a titanium nitride layer over the titanium silicide which inhibits migration of underlying silicon to the surface, and to react substantially all of the titanium overlying silicon oxide (SiO$_2$) regions of the wafer to form titanium nitride, and then raising the temperature to form a more stable phase of titanium silicide without risk of reaction between the silicon oxide and unreacted titanium thereon.

19 Claims, 3 Drawing Sheets

```
┌─────────────────────────────────────────────────────┐
│   CLEANING A SILICON SEMICONDUCTOR WAFER IN A       │
│   CLEANING CHAMBER USING ONE OR MORE REACTIVE       │
│         GASES WITH AN RF PLASMA                     │
└─────────────────────────────────────────────────────┘
                          │
┌─────────────────────────────────────────────────────┐
│   MOVING THE CLEANED WAFER TO A VACUUM DEPOSITION   │
│   CHAMBER WITHOUT EXPOSING THE CLEANED WAFER TO     │
│              OXYGEN-BEARING GASES                   │
└─────────────────────────────────────────────────────┘
                          │
┌─────────────────────────────────────────────────────┐
│    DEPOSITING A LAYER OF TITANIUM ON THE CLEANED    │
│              SEMICONDUCTOR WAFER                    │
└─────────────────────────────────────────────────────┘
                          │
┌─────────────────────────────────────────────────────┐
│   MOVING THE WAFER FROM THE VACUUM DEPOSITION       │
│   CHAMBER TO AN ANNEALING CHAMBER WITHOUT           │
│         EXPOSING THE COATED WAFER                   │
│            TO OXYGEN-BEARING GASES                  │
└─────────────────────────────────────────────────────┘
                          │
┌─────────────────────────────────────────────────────┐
│  ANNEALING THE COATED WAFER IN A NITROGEN-BEARING   │
│  ATMOSPHERE AT A FIRST TEMPERATURE OF FROM ABOUT    │
│   500° C TO ABOUT 695° C FOR A PERIOD OF FROM ABOUT │
│      20 SECONDS TO 60 SECONDS TO FORM TITANIUM      │
│   SILICIDE AND A LAYER OF TITANIUM NITRIDE OVER THE │
│    SILICIDE, AND TO REACT ALL OF THE TITANIUM OVER  │
│         SILICON OXIDE ($SiO_2$) SURFACES TO FORM    │
│                   TITANIUM NITRIDE                  │
└─────────────────────────────────────────────────────┘
                          │
┌─────────────────────────────────────────────────────┐
│     RAISING THE WAFER TEMPERATURE TO FROM ABOUT     │
│   800° C TO ABOUT 900° C TO CONVERT THE TITANIUM    │
│            SILICIDE TO A STABLE PHASE               │
└─────────────────────────────────────────────────────┘
                          │
┌─────────────────────────────────────────────────────┐
│      ETCHING THE WAFER TO REMOVE TITANIUM NITRIDE   │
└─────────────────────────────────────────────────────┘
```

Figure 1

SINGLE ANNEAL STEP PROCESS FOR FORMING TITANIUM SILICIDE ON SEMICONDUCTOR WAFER

BACKGROUND OF THE INVENTION

1. Field of the Invention

This invention relates to the processing of a semiconductor wafer to form an integrated circuit structure thereon. More particularly, this invention relates to an improved process for forming a layer of titanium silicide on a semiconductor wafer using a single annealing step.

2. Description of the Related Art

In the conventional formation of a titanium silicide layer, as a part of an integrated circuit structure on a semiconductor wafer such as a silicon wafer, those surfaces of the wafer on which the titanium silicide layer is to be formed are first cleaned to remove any materials which might interfere with reaction between the subsequently deposited titanium layer and the exposed silicon portions of the wafer. The surfaces are conventionally cleaned in a vacuum chamber using an inert gas such as argon with an rf plasma. This is sometimes preceded by an oxide wet etch.

Following these cleaning steps, a layer of titanium metal is conventionally deposited over the cleaned wafer structure, for example, using a vacuum sputtering deposition (PVD) process, usually to a thickness ranging from about 100 to about 1000 Angstroms.

The titanium coated wafer is then conventionally removed from the PVD chamber and transported through the ambient atmosphere to separate annealing apparatus where the structure is annealed in a nitrogen atmosphere and in the absence of oxygen (which would react with the titanium). Usually this annealing step comprises a rapid anneal where the structure is rapidly heated to the annealing temperature of from about 650° to about 675° C. in a few seconds and then maintained at this annealing temperature for from about 20 to about 60 seconds.

The nitrogen atmosphere used in this annealing step results in the simultaneous formation of a titanium nitride layer as the titanium reacts with the silicon to form titanium silicide. This titanium nitride acts as a blocking layer to prevent migration of silicon atoms to the surface, from the underlying silicon.

Following this anneal step, the wafer is conventionally removed from the annealing chamber and subjected to a wet etch to remove the titanium nitride blocking layer, as well as any remaining unreacted titanium. The etched wafer is then annealed again, however at a higher temperature of from about 800° to about 900° C., to convert the less stable C49 phase titanium silicide formed during the first annealing step to the more stable C54 phase.

The reason for annealing at a lower temperature during the first annealing step is to inhibit the formation of titanium oxide, (for example, by breakdown of the silicon oxide ($SiO_2$) comprising insulated regions on the surface of the wafer and reaction of the resulting oxygen with titanium), as well as to permit formation of the desired blocking layer of titanium nitride over the surface.

The reason for conducting the etching step prior to the second, higher temperature, anneal is to ensure removal from the wafer of any unreacted titanium, particularly unreacted titanium remaining over insulated areas, which might otherwise result in reaction with oxygen from the silicon oxide during the higher temperature anneal. Such unreacted titanium can be the result of the presence of titanium oxides on the surface of the titanium layer which shield underlying portions of the titanium layer over the insulated regions of the wafer from reaction with the nitrogen gas present in the annealing chamber during the first annealing step.

It would, however, be desirable to provide a process for the formation of a titanium silicide layer on a semiconductor wafer wherein a single annealing step could be utilized, prior to the etching step, to avoid removing the wafer from the annealing chamber, wet etching the wafer, drying the wafer, and then reintroducing the etched wafer back to the annealing chamber for a second annealing step.

SUMMARY OF THE INVENTION

It is, therefore, an object of this invention to provide an improved process for the formation of titanium silicide on a semiconductor wafer wherein a single annealing step is used to form a stable phase of titanium silicide on the wafer surface, without, however, forming titanium oxide on the wafer and/or titanium silicide over oxide portions of the wafer.

It is another object of this invention to provide an improved process for the formation of titanium silicide on a semiconductor wafer wherein oxygen is sufficiently excluded from the process to permit forming the titanium silicide, together with the desired blocking layer of titanium nitride, as well as reacting with nitrogen all of the titanium overlying oxide surfaces on the wafer, at a first annealing temperature; and then raising the annealing temperature to convert the unstable C49 phase titanium silicide to the stable C54 phase prior to an etching step to remove the titanium nitride from the wafer.

It is still another object of this invention to provide an improved process for the formation of titanium silicide on a semiconductor wafer wherein oxygen and/or oxygen-bearing gases are excluded from the process by transferring the wafer from a titanium deposition chamber to an annealing chamber without exposing the titanium coated wafer to oxygen or oxygen-bearing gases which would inhibit penetration of nitrogen atoms into the layer or inhibit formation of titanium nitride therein; then forming the titanium silicide, together with the desired blocking layer of titanium nitride, as well as reacting with nitrogen all of the titanium overlying oxide surfaces on the wafer, at a first annealing temperature; and then raising the annealing temperature to form a stable phase of titanium silicide prior to an etching step to remove the titanium nitride from the wafer.

It is yet a further object of this invention to provide an improved process for the formation of titanium silicide on a semiconductor wafer wherein oxygen-bearing gases such as air are further excluded from the process by cleaning the wafer using a reactive rf ion etch prior to depositing a layer of titanium on the wafer; transferring the wafer from the cleaning chamber to a titanium deposition chamber under vacuum without exposing the titanium coated wafer to oxygen-bearing gases; then transferring the wafer from the titanium deposition chamber to an annealing chamber under vacuum without exposing the titanium coated wafer to oxygen or oxygen-bearing gases; then forming the titanium silicide, together with the desired blocking layer of titanium nitride, as well as reacting with nitrogen all of the titanium overlying oxide surfaces on the wafer, at a first annealing temperature; and then raising the annealing temperature to form a stable phase of titanium silicide prior to an etching step to remove the titanium nitride from the wafer.

These and other objects of the invention will be apparent from the following description and accompanying drawings.

BRIEF DESCRIPTION OF THE DRAWINGS

FIG. 1 is a flowsheet illustrating the process of the invention.

DETAILED DESCRIPTION OF THE INVENTION

Figure 2:
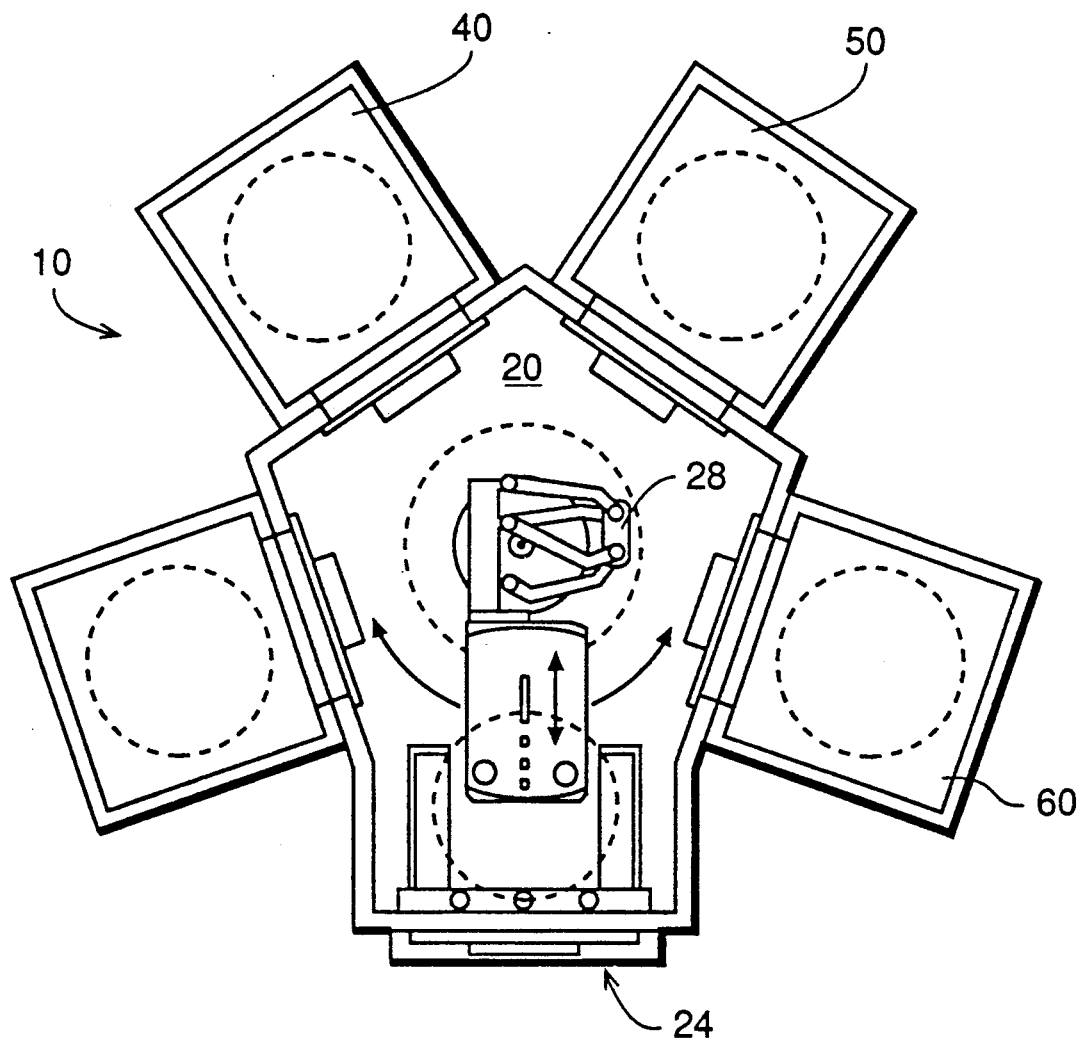
FIG. 2 is a top view of an apparatus suitable for carrying out the process of the invention.
Figure 3:
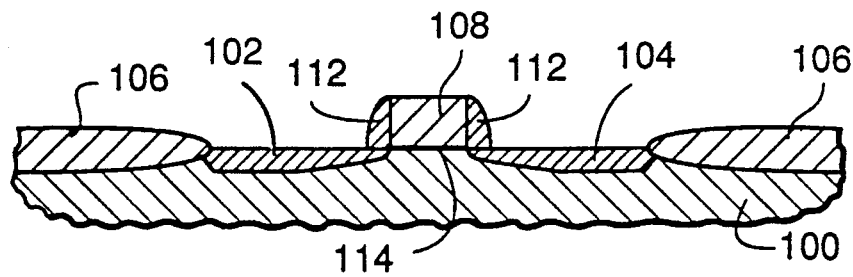
FIGS. 3–6 are sequential fragmentary vertical cross-sectional views illustrating formation of a titanium silicide layer formed on a silicon wafer using the process of the invention.

The process of the invention provides for the formation of a titanium silicide layer on a semiconductor wafer, in a nitrogen-bearing atmosphere and in the substantial absence of oxygen-bearing gases such as air, using a single annealing step in which all of the titanium over oxide portions of the wafer are converted to titanium nitride and which permits formation of a sufficient amount of a titanium nitride layer to block the migration of unreacted silicon atoms to the surface, while also forming a stable phase of titanium silicide.

By use of the expressions herein "substantial absence of oxygen-bearing gas" and/or "without substantially exposing the newly formed titanium layer to oxygen and/or oxygen-bearing gases" is meant that in the chambers respectively used for the titanium deposition and for annealing, as well as in the vacuum chamber used for the transfer of the wafer therebetween, the atmosphere will contain less than 10 ppm oxygen in any of the chambers.

By use of the term herein "in a nitrogen-bearing atmosphere" is meant an atmosphere containing at least 10 volume % nitrogen. The nitrogen may come from $N_2$ or from any other nitrogen-containing source which will decompose to provide a source of nitrogen without adding oxygen-bearing gases to the atmosphere, e.g., $NH_3$.

By use of the term "unreacted silicon atoms" is generally meant silicon which has not reacted with r titanium to form the corresponding silicide—or which is not already oxidized to form silicon oxide such as the $SiO_2$ insulation regions of the semiconductor wafer under portions of the deposited titanium layer.

In one aspect, the process of the invention includes the transfer of the semiconductor wafer, under vacuum and in the substantial absence of oxygen-bearing gases, from a titanium deposition chamber and to an annealing chamber, to inhibit or exclude oxygen in and/or on the newly formed titanium layer on the semiconductor wafer during the annealing portion of the process, which is then carried out in a single step at a first temperature to convert all of the titanium overlying oxide portions of the wafer to titanium nitride and to form the titanium silicide and the blocking layer of titanium nitride thereon, and then at a higher second temperature to convert the titanium silicide into a stable phase, prior to removal of the titanium nitride in a subsequent etching step.

In another aspect the process of the invention further includes the cleaning of the wafer, prior to the titanium deposition step, using a reactive rf ion etch to more thoroughly remove oxygen and/or oxygen-bearing gases from the wafer surface prior to the titanium deposition step, followed by moving the cleaned wafer from the cleaning chamber to the titanium deposition chamber without exposing the wafer to oxygen-bearing gases, then transferring the semiconductor wafer, under vacuum and in the substantial absence of oxygen-bearing gases, from the titanium deposition chamber to the annealing chamber, to inhibit or exclude oxygen in and/or on the newly formed titanium layer on the semiconductor wafer during the annealing portion of the process, which is then carried out in a single step at a first temperature to convert all of the titanium overlying oxide portions of the wafer to titanium nitride and to form the titanium silicide and the blocking layer of titanium nitride thereon, and then at a higher second temperature to convert the titanium silicide into a stable phase, prior to removal of the titanium nitride in a subsequent etching step.

The process of forming a titanium silicide layer on a semiconductor wafer, in the substantial absence of oxygen and/or oxygen-bearing gases such as air, is described and claimed in copending U.S. patent application Ser. No. 07/510,307, filed Apr. 16, 1990; assigned to the assignee of this invention and entitled "INTEGRATED PROCESSING SYSTEM FOR FORMING TITANIUM SILICIDE ON SEMICONDUCTOR WAFER", cross-reference to which is hereby made. In that application there is described a process for forming titanium silicide on a semiconductor wafer wherein oxygen-bearing gases are excluded by the transfer of the semiconductor wafer, under vacuum and in the substantial absence of oxygen-bearing gases, from a titanium deposition chamber to an annealing chamber, as well as by the cleaning of the wafer, prior to the titanium deposition step, using a reactive rf ion etch to more thoroughly remove oxygen and/or oxygen-bearing gases from the wafer surface prior to the titanium deposition step, followed by transfer of the cleaned wafer, under vacuum and in the substantial absence of oxygen-bearing gases, to the titanium deposition chamber.

Turning now to FIG. 2, apparatus useful for carrying out the process of the invention is generally indicated at 10 which comprises a sealed central chamber 20 into which a wafer may be loaded through a cassette load lock 24. Central chamber 20 may be maintained at a vacuum ranging from about $10^{-9}$ to about $10^{-5}$ Torr. In particular, oxygen and other oxygen-bearing gases such as air are excluded from central chamber 20.

Robotic means 28 may be provided within central chamber 20 to transfer the wafer between a cleaning chamber 30, a PVD chamber 40, and an annealing chamber 50 through central chamber 20. An optional degassing chamber 60 may also be provided as a part of apparatus 10, which will also be accessible through central vacuum chamber 20.

Multi-chambered vacuum apparatus for the processing of semiconductor wafers is generally described in Toshima U.S. Pat. No. 4,785,962, cross-reference to which is hereby made, and is commercially available, such as, for example, a 5000 Series wafer processing apparatus available from Applied Materials, Inc. in Santa Clara, CA, and such apparatus may be modified for the practice of the present invention.

In the practice of the process of the invention, a single wafer or a group of wafers on a tray is admitted into central chamber 20 of vacuum apparatus 10 through load lock 24 and then a single wafer is transferred to cleaning chamber 30 where the wafer is cleaned to remove any foreign materials from the wafer and, in particular, any oxides from the surface of the exposed silicon.

The wafer may be cleaned using a conventional inert gas RF etch, using argon as the inert gas. However, in accordance with a preferred embodiment of the process of the invention, the wafer is preferably cleaned using a reactive rf ion process such as a $NF_3$/argon mixture by flowing into cleaning chamber 30 from about 2 sccm to about 500 sccm of at least one reactive gas such as NF and from about 10 sccm to about 1000 sccm of a carrier gas such as argon while maintaining a vacuum of from about 1 to about 50 milliTorr in cleaning chamber 30 and an rf plasma at a power level ranging from about 20 to about 500 watts. The cleaning chamber is maintained at a temperature within a range of from about 27° to about 200° C. during the cleaning step which is carried out for a period of from about 1 to about 500 seconds.

Examples of reactive gases which can be used to carry out the reactive ion etch cleaning step of the invention include not only $NF_3$, but also fluorinated 1-2 carbon hydrocarbons such as, for example, $CHF_3$ and $CF_4$, as well as mixtures of same.

After the wafer has been cleaned, it is transferred out of cleaning chamber 30 back to central chamber 20 and then into deposition chamber 40 where a layer of titanium, having a thickness range of from about 100 to about 5000 Angstroms, preferably from about 100 to about 1000 Angstroms, and typically about 500 Angstroms, is conventionally deposited onto the wafer surface using, for example, a PVD sputtering process. It will be noted that in the preferred embodiment of the invention, the cleaned wafer removed from cleaning chamber 30 is not exposed to air or any other oxygen-containing gases, but is rather moved from cleaning chamber 30 through vacuum chamber 20 directly to deposition chamber 40.

After deposition of the titanium layer onto the wafer, the wafer is removed from deposition chamber 40 and, in accordance with the invention, directly transferred to annealing chamber 50 through vacuum chamber 20 without any exposure to oxygen or other oxygen-bearing gases, such as air, which might otherwise adsorb on or enter into the newly deposited titanium layer.

The annealing step of the process is then carried out by first annealing the wafer at a temperature ranging from about 500° up to about 695° C., and preferably at a temperature ranging from about 600° to about 675° C. The annealing step is preferably carried out under rapid anneal conditions where the wafer is ramped up to the initial annealing temperature at a rate of from about 5°/second to about 150° C./second, typically about 80° C./second, and the wafer is subject to the first annealing temperature for a period of from about 20 to about 60 seconds. The temperature is then raised to from about 800° to about 900° C. for an additional period of from about 20 to 60 seconds. This higher anneal temperature serves to convert the less stable C49 phase titanium silicide formed at the first annealing temperature to the more stable C54 phase, as is well known to those skilled in this art.

During the annealing step, one or more nitrogen-bearing gases are flowed into annealing chamber 50 at a rate ranging from about 500 to about 10,000 sccm while maintaining the pressure in said annealing chamber within a range of from about 100 milliTorr to about 800 Torr.

In a preferred mode of practicing the claimed process of the invention, the annealing step is carried out while maintaining a nitrogen vacuum or pressure level of from about 100 milliTorr to about 100 Torr, preferably from about 500 milliTorr to about 10 Torr, and most preferably from about 1 Torr to about 10 Torr, as described and claimed in copending U.S. patent application Ser. No. 07/509,928, filed Apr. 16, 1990; . assigned to the assignee of this invention and entitled "LOW NITROGEN PRESSURE PROCESS FOR FORMING TITANIUM SILICIDE ON SEMICONDUCTOR WAFER", cross-reference to which is hereby made. This use of low nitrogen pressure during the annealing step, while still forming sufficient TiN to block migration of unreacted silicon to the surface and to passivate the TiN grain boundaries, as well as to convert all titanium overlying oxide regions of the wafer to titanium nitride, is made possible by the exclusion of exposure of the wafer to oxygenbearing gases prior to the first anneal step in accordance with the practice of the invention claimed herein.

After the annealing step, the titanium nitride (TiN), formed over the titanium silicide as well as over silicon oxide ($SiO_2$) portions of the wafer, may be selectively removed using a wet etch such as a mixture of 4 parts by weight $H_2O$, 1 part by weight $H_{2O2}$, and 1 part by weight $NH_4OH$ which will remove titanium nitride in preference to titanium silicide and/or silicon oxide.

Referring now to FIGS. 3-6, a silicon semiconductor wafer 100 is shown having silicon oxide ($SiO_2$) isolation regions 106 previously formed in the surface of the wafer and an MOS structure comprising a source region 102, a drain region 104, and a gate electrode 108 formed over gate oxide 114 with oxide spacers 112 formed on the sidewalls of gate electrode 108. Titanium silicide will be formed over the source and drain regions and over the gate electrode as a part of the construction of the electrical contacts for the MOS device.

Figure 4:
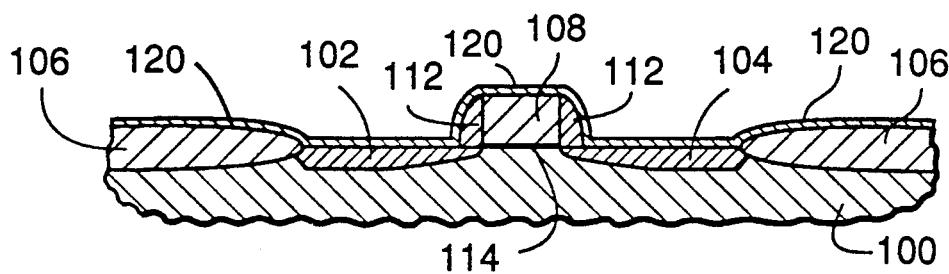

As previously described, the wafer is first cleaned to prepare the surface for deposition of titanium layer 120 which is shown deposited on the wafer structure in FIG. 4. The titanium coated wafer is then moved to an annealing chamber, without exposing the titanium surface to oxygen-bearing gases.

Figure 5:
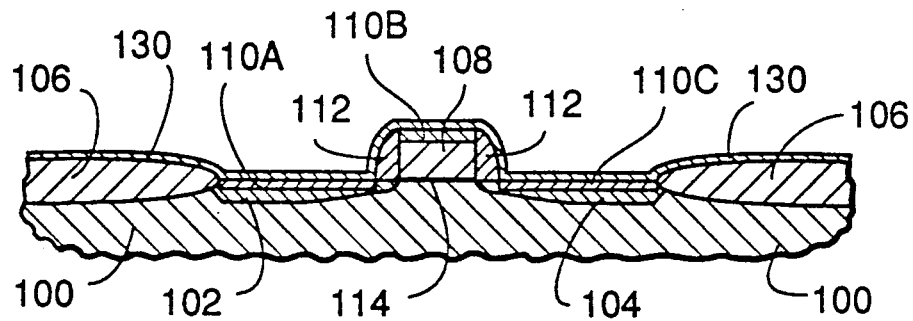

FIG. 5 shows the structure resulting from the annealing step. The titanium in those portions of titanium layer 120 in direct contact with silicon (either single crystal or polycrystalline silicon), i.e., the titanium over source region 102, drain region 104, and gate electrode 108, reacts with the silicon, at the lower annealing temperature, to form titanium silicide, as shown at 110A, 110B, and 110C. A layer of titanium nitride 130 is formed over the entire structure by reaction between titanium layer 120 and the nitrogen-bearing gas present in the annealing chamber.

It should be noted that all of the titanium in those portions of layer 120 overlying isolation oxide regions 106 and oxide spacers 112 reacts with the nitrogen to form titanium nitride at the lower annealing temperature so that when the annealing temperature is then raised, there is no unreacted titanium over the oxide regions available to react with the silicon oxide at the higher annealing temperature to form titanium silicides and/or titanium oxides over the silicon oxide regions of the structure.

While it is not the intention to be bound by any theories of operation, the total reaction with nitrogen of all of the titanium overlying the oxide areas during the first, lower temperature annealing, which makes it feasible to perform all of the annealing in a single step, is thought to be made possible by the exclusion of oxygen-bearing gases from the process which might otherwise form titanium oxides which would interfere with complete reaction between nitrogen and the titanium overlying the oxide regions, leaving unreacted titanium to react with the silicon oxides at the higher annealing temperature.

Figure 6:
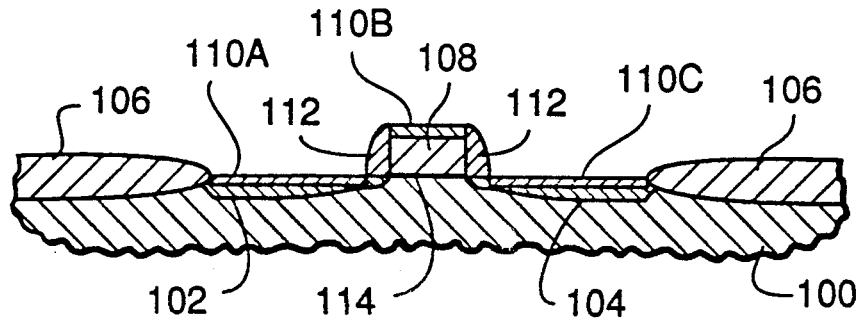

The final structure is shown in FIG. 6, after removal of the titanium nitride layer by the previously described wet etch. No titanium reaction products remain over oxide surfaces 106 and 112, while titanium silicide portions 110A, 110B, and 110C are left, respectively over source region 102, drain region 104, and gate electrode 108.

Thus, the invention provides an improved process for forming a layer of titanium silicide on the surface of a semiconductor wafer using a single annealing step wherein excluding oxygen and/or oxygen-bearing gases such as air from the wafer, after deposition of the titanium layer thereon, results in the complete reaction with nitrogen, at the lower annealing temperature, of all of the titanium overlying oxide regions of the silicon semiconductor wafer, thus permitting subsequent annealing at a higher temperature to form a more stable phase of titanium silicide without first removing the titanium nitride layer. The exclusion of oxygen-bearing gases from the process further results in formation of a titanium silicide coating having more nitrogen on the surface, and deeper penetration of the nitrogen into the titanium silicide layer, resulting in more adequate formation of a titanium nitride blocking layer over the titanium silicide at the first annealing temperature whereby essentially no unreacted silicon migrates to the surface from or through the newly formed titanium silicide layer.

Having thus described the invention what is claimed is:

1. An improved process for forming a conductive layer of titanium silicide on a silicon semiconductor wafer containing silicon and silicon oxide surfaces which comprises:
   a) forming a titanium layer over the wafer in a vacuum deposition chamber in the substantial absence of oxygenbearing gases;
   b) transferring the titanium coated wafer to a sealed annealing chamber without substantially exposing the newly formed titanium layer to oxygen-bearing gases; and
   c) annealing the titanium-coated silicon semiconductor wafer in a nitrogen-bearing atmosphere in said sealed annealing chamber, and in the substantial absence of oxygen-bearing gases, in a single annealing step without an intervening etching step comprising:
      i) a first annealing temperature which will form a layer of titanium silicide over silicon surfaces of said wafer, titanium nitride over said titanium silicide, and convert all of the titanium over said silicon oxide surfaces to titanium nitride; and
      ii) a second annealing temperature to convert said titanium silicide into a stable phase of titanium silicide on said wafer.

2. The process of claim 1 wherein said annealing step further comprises initially heating said wafer to a first temperature ranging from about 500° up to about 695° C. for a time period ranging from about 20 seconds to about 60 seconds by raising the temperature of said wafer at a rate within a range of from about 520 /second to about 150°/second to form said titanium silicide and said titanium nitride.

3. The process of claim 2 wherein said annealing step additionally comprises further annealing of said wafer at a second temperature ranging from about 800° to about 900° C. for an additional time period ranging from about 20 to about 60 seconds to convert said titanium silicide into a stable phase.

4. The process of claim 3 including the further step of etching said wafer, after said annealing step, to remove titanium nitride from said wafer.

5. The process of claim 1 wherein said annealing step comprises annealing said wafer at a first temperature ranging from about 500° up to about 695° C. for a time period ranging from about 20 seconds to about 60 seconds by raising the temperature of said wafer at a rate within a range of from about 5°/second to about 150° C./second, and then further annealing said wafer at a second temperature ranging from about 800° to about 900° C. for an additional time period ranging from about 20 to about 60 seconds.

6. The process of claim 5 wherein said annealing temperature is raised from said first temperature range up to said second temperature range by raising the temperature of said wafer at a rate of from about 520 /second to about 150° C./second.

7. The process of claim 5 which further includes reacting all of the titanium overlying silicon oxide ($SiO_2$) regions on said wafer with nitrogen in said annealing chamber during said annealing at said first temperature to form titanium nitride whereby subsequent annealing of said wafer at said second higher temperature will not result in reaction between said silicon oxide and unreacted titanium overlying said silicon oxide.

8. The process of claim 5 wherein said nitrogenbearing atmosphere in said annealing chamber is maintained, during said first annealing step, at a pressure ranging from about 100 milliTorr to about 800 Torr while flowing one or more nitrogen-bearing gases into said chamber at a rate ranging from about 500 to about 10,000 sccm.

9. The process of claim 1 wherein said annealing step further comprises annealing said wafer at a first temperature ranging from about 600 ° up to about 675° C. for a time period ranging from about 20 seconds to about 60 seconds by raising the temperature of said wafer at a rate within a range of from about 5°/second to about 150° C./second, and then further annealing said wafer at a second temperature ranging from about 800° to about 900° C. for an additional time period ranging from the temperature of said wafer at a rate of from about 5°/second to about 150° C./second.

10. The process of claim 6 which further includes transferring said wafer from said vacuum deposition chamber to said sealed annealing chamber through a sealed central chamber maintained at a pressure ranging from about $10^{-9}$ to about $10^{-5}$ Torr which is interconnected to both said vacuum deposition chamber and said sealed annealing chamber to avoid substantially exposing the newly formed titanium layer to oxygen and/or oxygen-bearing gases.

11. The process of claim 6 which comprises the further steps of:
   a) cleaning said wafer in a cleaning chamber using a gaseous mixture which includes at least one reactive gas while maintaining an rf plasma in said cleaning chamber to remove oxides and other materials from the silicon surfaces thereon prior to said titanium deposition step; and
   b) transferring said cleaned wafer from said cleaning chamber to said vacuum deposition without substantially exposing said cleaned wafer to oxygen and/or one or more oxygen-bearing gases using a sealed central chamber maintained at a pressure ranging from about $10^{-9}$ to about $10^{-5}$ Torr which is interconnected to both said cleaning chamber and said vacuum deposition chamber.

12. The process of claim 11 wherein said cleaning step further comprises flowing into said cleaning chamber a gaseous mixture containing at least one reactive gas at a rate of from about 2 to about 500 sccm reactive gas and from about 10 to about 1000 sccm carrier gas while maintaining said plasma at a power ranging from about 20 to about 500 watts for a period of time ranging from about 1 to about 500 seconds.

13. The process of claim 6 wherein said titanium deposition step further comprises depositing a titanium layer ranging in thickness from about 100 to about 5000 Angstroms.

14. An improved process for forming titanium silicide on a silicon semiconductor wafer using a single annealing step at first and second temperature without an intervening etching step which comprises:
   a) providing a silicon semiconductor wafer having one or more silicon surface regions on which said titanium silicide is to be formed;
   b) cleaning said wafer in a sealed cleaning chamber using an rf plasma and a gaseous mixture which includes at least one reactive gas;
   c) transferring the cleaned wafer to a vacuum deposition chamber without substantially exposing said cleaned wafer to oxygen-bearing gases by transferring said wafer through a sealed central chamber which is interconnected to both said vacuum deposition chamber and said cleaning chamber;
   d) forming a titanium layer over said cleaned wafer in said vacuum deposition chamber in the substantial absence of oxygen-bearing gases;
   e) transferring the titanium coated wafer to an annealing chamber without substantially exposing the newly formed titanium layer to oxygen-bearing gases by transferring said wafer through a sealed central chamber which is interconnected to both said vacuum deposition chamber and said sealed annealing chamber; and
   f) annealing the titanium-coated silicon semiconductor wafer in a nitrogen-bearing atmosphere in said annealing chamber, and in the substantial absence of oxygen-bearing gases, by initially heating said wafer to a first temperature ranging from about 500° up to about 695° C. for a time period ranging from about 20 seconds to about 60 seconds by raising the temperature of said wafer at a rate within a range of from about 5°/second to about 150° C./second to form titanium silicide, and to form titanium nitride over said titanium silicide and over silicon oxide ($SiO_2$) surfaces on said wafer, and then, without removing the wafer from said annealing chamber, further annealing said wafer at a second temperature ranging from about 800° to about 900° C. for an additional time period ranging from about 20 to about 60 seconds to convert said titanium silicide to a stable phase.

15. The process of claim 14 including the further step of etching said wafer, after said annealing step, to remove titanium nitride from said wafer.

16. The process of claim 14 wherein said first annealing temperature ranges from about 600° to about 675° C.

17. The process of claim 14 which further includes reacting all of the titanium overlying silicon oxide ($SiO_2$) regions on said wafer with nitrogen in said annealing chamber during said annealing at said first temperature to form titanium nitride whereby subsequent annealing of said wafer at said second higher temperature will not result in reaction between said silicon oxide and unreacted titanium overlying said silicon oxide.

18. An improved process for forming titanium silicide on a silicon semiconductor wafer using a single annealing step at first and second temperature without an intervening etching step which comprises:
   a) providing a silicon semiconductor wafer having one or more silicon surface regions on which said titanium silicide is to be formed;
   b) cleaning said wafer in a sealed cleaning chamber using an rf plasma and a gaseous mixture containing at least one reactive gas;
   c) transferring the cleaned wafer to a vacuum deposition chamber without substantially exposing said cleaned wafer to oxygen-bearing gases by transferring said wafer through a sealed central chamber which is interconnected to both said vacuum deposition chamber and said cleaning chamber;
   d) forming a titanium layer over said cleaned wafer in said vacuum deposition chamber in the substantial absence of oxygen-bearing gases;
   e) transferring the titanium coated wafer to an annealing chamber without substantially exposing the newly formed titanium layer to oxygen-bearing gases by transferring said wafer through a sealed central chamber which is interconnected to both said vacuum deposition chamber and said sealed annealing chamber;
   f) annealing the titanium-coated silicon semiconductor wafer in a nitrogen-bearing atmosphere in said annealing chamber, and in the substantial absence of oxygen-bearing gases, at a first temperature ranging from about 600° to about 675° C. for a period of time ranging from about 20 seconds to about 60 seconds by raising the temperature of said wafer at a rate within a range of from about 5°/second to about 150° C./second to form said titanium silicide, as well as to form titanium nitride over said titanium silicide which inhibits migration of underlying silicon to the surface, and to react substantially all of the titanium overlying silicon oxide ($SiO_2$) regions on said wafer to form titanium nitride, whereby subsequent annealing of said wafer at a higher temperature will not result in reaction between said silicon oxide and unreacted titanium overlying said silicon oxide; and
   g) then, without removing the wafer from said annealing chamber, raising the wafer temperature at a rate within a range of from about 5°/second to about 150° C./second to a second temperature ranging from about 800° to about 900° C. to further anneal said wafer for an additional time period ranging from about 20 to about 60 seconds to convert said titanium silicide into a stable phase.

19. The process of claim 18 including the further step of etching said wafer, after said annealing step, to remove titanium nitride from said wafer.

* * * * *